(12) United States Patent
Vaishampayan et al.

(10) Patent No.: US 9,506,984 B1
(45) Date of Patent: Nov. 29, 2016

(54) PROTOCOL BASED AUTOMATED TESTER STIMULUS GENERATOR

(71) Applicant: Intel Corporation, Santa Clara, CA (US)

(72) Inventors: Paraag Vaishampayan, Phoenix, AZ (US); Mehul Sagar, Chandler, AZ (US); Chong Yih Khoo, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/790,764

(22) Filed: Jul. 2, 2015

(51) Int. Cl.
*G01R 31/28* (2006.01)
*G01R 31/3177* (2006.01)
*G01R 31/319* (2006.01)
*G11C 29/04* (2006.01)
*G11C 29/14* (2006.01)
*G11C 29/56* (2006.01)

(52) U.S. Cl.
CPC ....... *G01R 31/3177* (2013.01); *G01R 31/2806* (2013.01); *G01R 31/31917* (2013.01); *G11C 29/14* (2013.01); *G01R 31/2884* (2013.01); *G11C 29/56* (2013.01); *G11C 2029/0401* (2013.01)

(58) Field of Classification Search
CPC .......... G01R 31/2806; G01R 31/2884; G01R 31/31917; G11C 29/14; G11C 29/56; G11C 29/56012; G11C 2029/0401
USPC ....................................................... 714/738
See application file for complete search history.

(56) References Cited

U.S. PATENT DOCUMENTS

| 6,727,723 | B2* | 4/2004 | Shimizu | G01R 31/2884 324/750.05 |
| 6,834,361 | B2* | 12/2004 | Abbott | G11C 29/26 714/42 |
| 6,845,477 | B2* | 1/2005 | Hidaka | G11C 29/48 324/757.03 |
| 6,889,348 | B2* | 5/2005 | Sato | G01R 31/31813 324/762.01 |
| 7,673,204 | B2* | 3/2010 | Krishnakalin | G01R 31/31854 714/728 |
| 7,673,209 | B2* | 3/2010 | Park | G11C 29/10 714/738 |
| 8,872,531 | B2* | 10/2014 | Song | G01R 31/31922 324/750.08 |
| 2003/0099139 | A1* | 5/2003 | Abrosimov | G11C 29/56 365/200 |
| 2008/0178053 | A1* | 7/2008 | Gorman | G01R 31/31724 714/718 |

* cited by examiner

*Primary Examiner* — James C Kerveros
(74) *Attorney, Agent, or Firm* — Schwegman Lundberg & Woessner, P.A.

(57) ABSTRACT

Some forms relate to a SOC testing apparatus. The example SOC testing apparatus includes an input interface and a protocol decode agent that receives transmission signals through the input interface. The protocol decode agent generates testing stimuli for a SOC based on the transmission signals. The SOC testing apparatus further includes an output interface and a test vector generator that receives the testing stimuli from the protocol decode agent and supplies the testing stimuli as digital signals to the output interface. The protocol decode agent decodes the traffic received from the input interface. The protocol decode agent then determines the correct testing stimuli to be applied to the SOC. The protocol decode agent may be a software model of the IO protocol being used to interact with the DUT. The protocol decode agent may determine what type of protocol is included in the signals received from the SOC.

16 Claims, 6 Drawing Sheets

PROTOCOL BASED AUTOMATED TESTER STIMULUS GENERATOR

BACKGROUND

The simulation time in conventional full chip functional tests can take days or weeks in existing silicon on chip (hereafter SOC) products. The length of the simulation time typically depends on (i) the test duration; (ii) the target electronic device; and (iii) the number of active electronic components with the electronic device.

In addition, as computer systems continue to develop, there are increasing timing differences that occur between registered transfer level (hereafter RTL) models and actual silicon. These increasing timing differences cause additional debug time and other time delays that inhibit high volume manufacturing (hereafter HVM) of developing SOCs. The additional debug time and other time delays directly affect product ramps and time to market (TTM).

Modern functional testing emulators might address some of the delay issues associated with HVM of developing SOCs. However, such emulators are usually expensive to maintain and are typically incapable of addressing issues stemming from the RTL vs. silicon timing differences.

DESCRIPTION OF EMBODIMENTS

Figure 1:
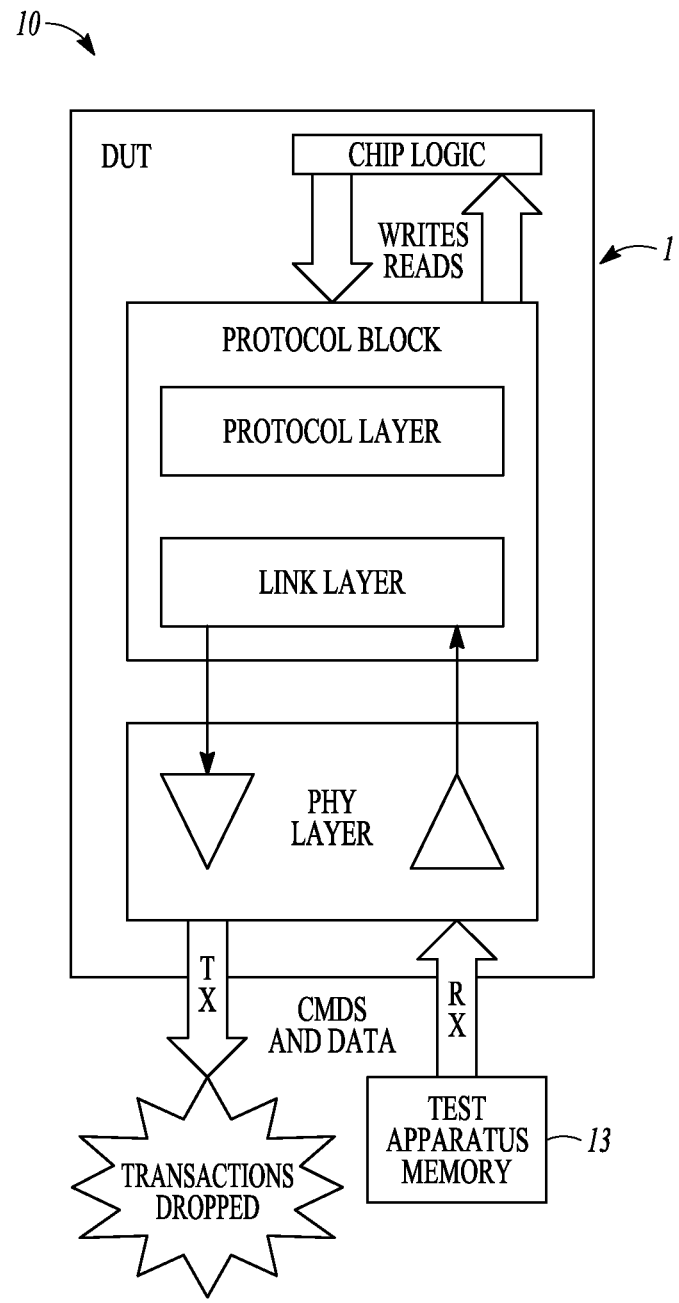
FIG. 1 illustrates a prior art SOC testing apparatus.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The methods and SOC testing apparatuses described herein utilize the actual silicon in the SOCs that are tested as a model to potentially improve HVM of the SOCs and/or address any inaccurate timing issues that are associated with using typical RTL.

The methods and SOC testing apparatuses described herein are connected to the device under test (hereafter DUT) IO to monitor signal traffic across the IO interface. In addition, the methods and SOC testing apparatuses described herein may model the IO protocol and create appropriate tester stimuli for the DUT at run time as well as validating the tester stimuli in the process.

The signal traffic across the SOC IO is saved as a sequence of tester stimuli which results in better and faster tester stimuli for HVM of the SOCs. The use of actual silicon as a test simulator may significantly speed up the generation of the tester stimuli and at the same time address any timing inaccuracies that are caused by the differences in RTL modelling and actual silicon execution.

As an example, the methods and SOC testing apparatuses described herein may be better than RTL based content generation (e.g. VCS) in terms of speed. In addition, developing SOCs are increasingly validated within insufficient timing models and have several clock crossing boundaries in their designs. These insufficient timing models lead to issues enabling silicon friendly content in HVM. Since the methods and SOC testing apparatuses described herein learn from silicon to generate HVM testing stimuli, the timing differences between RTL and silicon may be more properly addressed, especially when compared to known types of simulators (e.g., emulation, VCS).

The need for timing accurate testing is essential for faster Time to Market (hereafter TTM) of developing computer systems. With the complications associated with developing more elaborate RTL designs as well as moving away from complex Gate Level Simulations, achieving silicon timing accuracy when testing of SOCs is becoming more difficult.

FIG. 1 illustrates a prior art SOC 1 and a prior art SOC testing apparatus 10. FIG. 1 shows where traffic TX is dropped and not used by the conventional SOC testing apparatus 10. Test vectors are prepopulated and saved into the conventional SOC testing apparatus memory 13.

Figure 2:
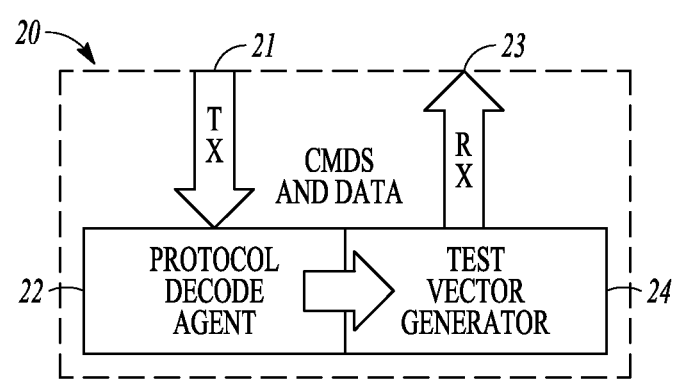
FIG. 2 illustrates an example SOC testing apparatus.

FIG. 2 illustrates an example SOC testing apparatus 20. The example SOC testing apparatus 20 includes an input interface 21 and a protocol decode agent 22 that receives transmission signals TX through the input interface 21. The protocol decode agent 22 generates testing stimuli for a SOC 30 (not shown in FIG. 2 but shown in FIG. 3) based on the transmission signals TX.

The example SOC testing apparatus 20 further includes an output interface 23 and a test vector generator 24 that receives the testing stimuli from the protocol decode agent 22 and supplies the testing stimuli as digital signals RX to the output interface 23.

The protocol decode agent 22 decodes the TX traffic received from the input interface 21. The protocol decode agent 22 then determines the correct testing stimuli to be applied to the SOC 30. In some forms, the protocol decode agent 22 may be a software model of the IO protocol being used to interact with the DUT (e.g., SOC 30 in FIG. 3). In addition, the protocol decode agent 22 may determine what type of protocol is included in the TX signals that are received from the SOC 30.

The protocol decode agent 22 then delivers the testing stimuli to the test vector generator 24. The test vector generator 24 converts the testing stimuli to digital signals RX which are delivered to the SOC 30 (sometimes after the appropriate time response delay).

In some example forms of the SOC testing apparatus 20, the input interface 21 may be the same type of component as the output interface 23. It should be noted that forms are contemplated where the input interface 21 is a different type of component as the output interface 23 or part of the same overall component. The type of input interface 21 and output interface 23 will depend on the type of testing that is to be done by the SOC testing apparatus 20 and/or the type of SOC 30 that is to be tested (among other factors).

Figure 3:
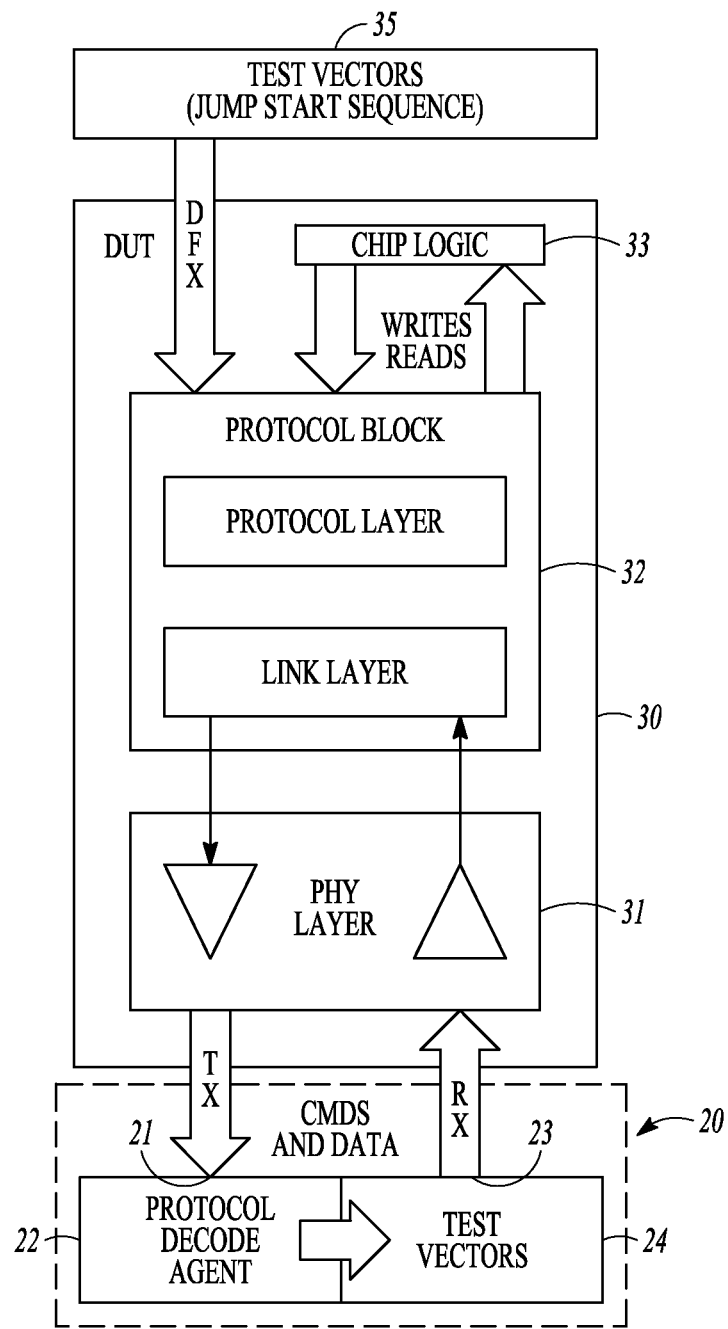
FIG. 3 shows the example SOC testing apparatus of FIG. 2 attached to a SOC.

As shown in FIG. 3, the SOC testing apparatus 20 may include a SOC 30 connected to the input interface 21 and the output interface 23. The SOC 30 includes a physical layer 31 that supplies the transmission signals TX to the input interface 21 and receives tester stimuli as digital signals RX from the output interface 23. The physical layer 31 may be concerned with the transmission and reception of the raw digital bit stream over a physical medium.

The physical layer 31 may provide data encoding (i.e., modifying a simple digital signal pattern (1s and 0s) to electrical or optical signals for the physical medium). The physical layer 31 plays with most of the physical connections (e.g., wireless transmissions), cabling, cabling standards and types, connectors and types and network interface cards (among other examples).

In some forms, the SOC 30 includes a protocol block 32 that receives testing stimuli from the physical layer 31 and delivers transmissions signals to the physical layer 31. The protocol block 32 may ensure that messages are delivered error free, in sequence and with no losses or duplication. The protocol block 32 may also provide segmentation for messages (i.e., splits the protocol messages into smaller units), message acknowledgment and message traffic control. The protocol block 32 may be a Double Data Rate (DDR) protocol, eMMC (Embedded Multimedia Card) Protocol and/or PCIExpress Protocol (among other examples).

The SOC 30 may further includes chip logic 33 that executes the testing stimuli received from the protocol block 32 and delivers new messages to the protocol block 32. The chip logic 33 may perform arithmetic and logical operations. In addition, the chip logic 33 may extract instructions and data from the protocol layer and then decode and execute them in order to generate output signals. The chip logic 33 may be a Central Processing Unit, Graphics and Multiple media unit, Image processing Unit and/or memory controller unit (among other examples).

In some forms, the testing for the DUT (e.g., SOC 30) may be initially started using a predefined sequence of tester vector stimulus to get the SOC 30 to a known state where control is transferred to the SOC 30. The protocol decode agent 22 then responds to the SOCs requests by learning and then analyzing the TX traffic from the input interface 21. As shown in FIG. 3, the SOC testing apparatus 20 may further include a predefined sequence tester 35 that initially supplies testing stimuli DFX to the SOC 30 through another input interface of the SOC 30.

The example SOC testing apparatuses 20 described herein may eliminate the need to use test vectors that are determined using time consuming RTL simulations. The protocol decode agent 22 may not only generate the test vector stimuli automatically but may also eliminate the need for RTL simulations altogether. Eliminating the need for RTL simulations may save test time and help SOC 30 products reach production quality faster.

Figure 4:
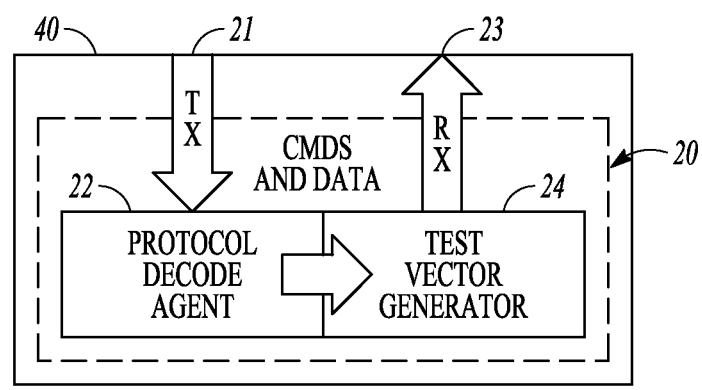
FIG. 4 shows the SOC testing apparatus of FIG. 2 where the SOC testing apparatus is part of a testing device.

FIG. 4 shows the SOC testing apparatus 20 of FIG. 2 where the SOC testing apparatus 20 is part of a testing device 40. In some forms, the testing device 40 may include one, some, or all of the input interface 21, the output interface 23, the protocol decode agent 22 and the test vector generator 24.

The testing device 40 may be any type of SOC testing device that is known now or discovered in the future. The type of testing device 40 will depend in part on (i) the type of testing that is done to the SOC 30; (ii) the type and size of the SOC 30; and/or (iii) the type and number of electrical components that are to be tested on the SOC 20 (among other factors).

Figure 5:
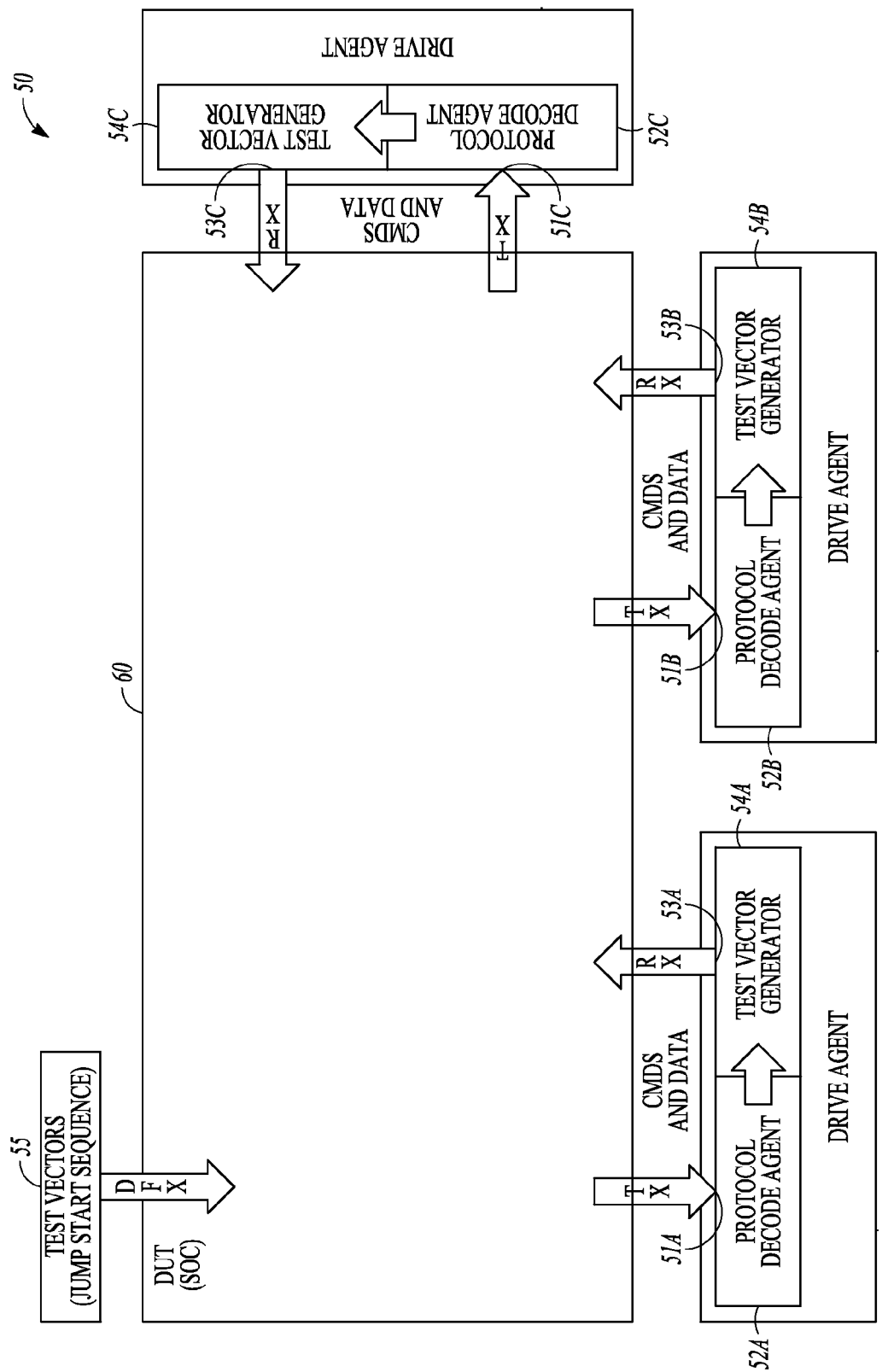
FIG. 5 shows another example SOC testing apparatus attached to a SOC.

FIG. 5 shows another example SOC testing apparatus 50 attached to a SOC 60. The SOC testing apparatus 50 includes a plurality of input interfaces 51A, 51B, 51C and a plurality of protocol decode agents 52A, 52B, 52C that each receives transmission signals TX from one of the respective input interfaces 51A, 51B, 51C. The protocol decode agents 52A, 52B, 52C generating testing stimuli for the SOC 60 based on the received transmission signals TX.

The SOC testing apparatus 50 further includes a plurality of output interfaces 53A, 53B, 53C and a plurality of test vector generators 54A, 54B, 54C. The plurality of test vector generators 54A, 54B, 54C each receive testing stimuli from one of the protocol decode agents 52A, 52B, 52C. The plurality of test vector generators 54A, 54B, 54C each supply the testing stimuli as digital signals RX to one of the respective output interfaces 53A, 53B, 53C.

In some forms, each of the protocol decode agents 52A, 52B, 52C determines what type of protocol is included in the signals TX that are received from one or more components of the SOC 60 (no components are shown on SOC 60). The respective protocol decode agents 52A, 52B, 52C decode the TX traffic received from the respective input interfaces 51A, 51B, 51C. The protocol decode agents 52A, 52B, 52C then determine the correct testing stimuli to be applied to the SOC 60.

In some forms, some of the protocol decode agents 52A, 52B, 52C may be a software model of the IO protocol being used to interact with the SOC 60. In addition, the respective protocol decode agents 52A, 52B, 52C may determine what type of protocol is included in the TX signals that are received from one or more components of the SOC 60.

In some forms, the testing for the DUT (e.g., SIC 60) may be initially started using a predefined sequence of tester vector stimuli to get one, some or all of the components on the SOC 60 to a known state where control is transferred to the SOC 60. The protocol decode agents 52A, 52B, 52C then respond to the SOCs requests by learning and then analyzing the TX traffic from the input interfaces 51A, 51B, 51C. As shown in FIG. 5, the SOC testing apparatus 50 may further include a predefined sequence tester 55 that supplies the initial testing stimuli to the SOC 60 through another input interface of the SOC 60.

Figure 6:
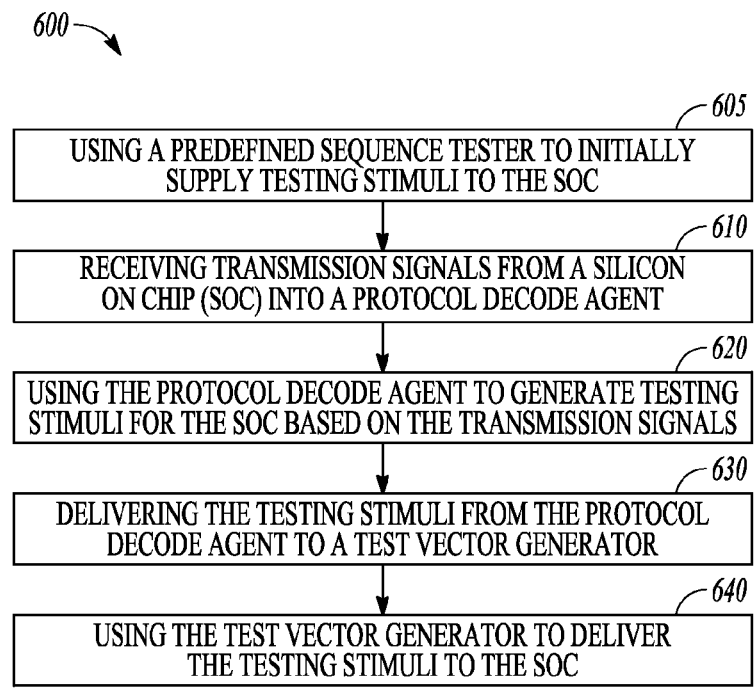
FIG. 6 is a flow diagram illustrating a method of testing a SOC.

FIG. 6 is a flow diagram illustrating a method [600] of testing an SOC (see, e.g., SOC 30 in FIG. 3). The method [600] includes [610] receiving transmission signals TX from an SOC 30 into a protocol decode agent 22 and [620] using the protocol decode agent 22 to generate testing stimuli for the SOC 30 based on the transmission signals TX. The method [600] further includes [630] delivering the testing stimuli from the protocol decode agent 22 to a test vector generator 24 and [640] using the test vector generator 24 to deliver the testing stimuli to the SOC 30.

In some forms, [610] receiving transmission signals TX from an SOC 30 into a protocol decode agent 22 includes receiving the transmission signals TX from the SOC 30 through an input interface 21. In addition, [640] using the test vector generator 24 to provide the testing stimuli to the SOC 30 may include using the test vector generator 24 to provide the testing stimuli to the SOC 30 through an output interface 23.

The method [600] may further include [605] using a predefined sequence tester 35 to initially supply testing stimuli to the SOC 30 (see, e.g., FIG. 3). As an example, the predefined sequence tester 35 may initially supply testing stimuli to the SOC 30 through another input interface of the SOC 30.

In some forms, [610] receiving transmission signals TX from a SOC 30 includes receiving transmission signals TX from a SOC into a testing device 40 where the protocol decode agent 22 is located (see, e.g., FIG. 4). The testing device 40 may be any type of SOC testing device that is known now or discovered in the future.

It should be noted that [620] using a protocol decode agent 22 to generate testing stimuli for the SOC based on the received transmission signals TX may include determining what type of protocol is included in the signals TX that are received from the SOC 30. As discussed above, the protocol decode agent 22 may not only generate the test vector stimuli automatically but may also eliminate the need for RTL simulations altogether.

In some forms, [630] delivering the testing stimuli from the protocol decode agent 22 to a test vector generator 24 may include converting protocol commands into digital signals RX. In addition, [640] using the test vector generator 24 to provide the testing stimuli to the SOC 30 may include delivering the testing stimuli as digital signals RX from a testing device 40 where the test vector generator 24 is located to the SOC 30.

Other forms of the method [600] are contemplated (see, e.g., FIG. 5) where [610] receiving transmission signals from a SOC into a protocol decode agent may include receiving a plurality of transmission signals RX from a SOC 60 into a plurality of respective protocol decode agents 52A, 52B, 52C. In addition, [640] using the test vector generator to deliver the testing stimuli to the SOC may include using a plurality of test vector generators 54A, 54B, 54C to deliver the testing stimuli as digital signals RX to the SOC 60.

The methods described herein may improve the testing quality of SOCs as the actual interfaces that connected to the DUT are utilized and not design for test (DFT) interfaces which are conventionally used for testing purposes. In addition, the methods described herein may improve the TTM by delivering faster test times due to the elimination of some of some, or all, RTL simulations. The methods described herein may also reduce testing cost as the testing may be done under HVM conditions while potentially eliminating the need for a full motherboard test socket.

To better illustrate the methods and SOC testing apparatuses described herein, a non-limiting list of forms is provided here.

Example 1 includes a system on chip (SOC) testing apparatus. The SOC testing apparatus includes an input interface and a protocol decode agent that receives transmission signals from the input interface. The protocol decode agent generates testing stimuli for a SOC based on the transmission signals. The SOC testing apparatus further includes an output interface and a test vector generator that receives the testing stimuli from the protocol decode agent. The test vector generator supplies the testing stimuli as digital signals to the output interface.

Example 2 includes the SOC testing apparatus of claim 1, wherein the input interface is the same type of device as the output interface.

Example 3 includes the SOC testing apparatus of any one of examples 1-2, further including a testing device that includes the input interface, the output interface, the protocol decode agent and the test vector generator.

Example 4 includes the SOC testing apparatus of any one of examples 1-3, wherein the protocol decode agent determines what type of protocol is included in the signals that are received from the SOC.

Example 5 includes the SOC testing apparatus of any one of examples 1-4, further including a SOC connected to the input interface and the output interface.

Example 6 includes the SOC testing apparatus of any one of examples 1-5, wherein the SOC includes a physical layer that supplies the transmission signals to the input interface and receives tester stimuli from the output interface.

Example 7 includes the SOC testing apparatus of any one of examples 1-6, wherein the SOC includes a protocol block that receives testing stimuli from the physical layer and delivers transmissions signals to the physical layer.

Example 8 includes the SOC testing apparatus of any one of examples 1-7, wherein the SOC includes chip logic that executes the testing stimuli received from the protocol block and delivers further transmissions to the protocol block.

Example 9 includes the SOC testing apparatus of any one of examples 1-8, further comprising a predefined sequence tester that initially supplies testing stimuli to the SOC through another input interface of the SOC.

Example 10 includes a system on chip (SOC) testing apparatus. The SOC testing apparatus includes a plurality of input interfaces and a plurality of protocol decode agents that each receive transmission signals from one of the respective input interfaces. The protocol decode agents generate testing stimuli for an SOC based on the received transmission signals. The SOC testing apparatus further includes a plurality of output interfaces and a plurality of test vector generators that each receive testing stimuli from one of the protocol decode agents and each supply the testing stimuli as digital signals to one of the respective output interfaces.

Example 11 includes SOC testing apparatus of example 10, wherein each of the protocol decode agents determines what type of protocol is included in the signals that are received from the SOC.

Example 12 includes the SOC testing apparatus of examples 10-11, further including a predefined sequence tester that initially supplies testing stimuli to the SOC through another input interface of the SOC.

Example 13 includes a method that includes receiving transmission signals from a silicon on chip (SOC) into a protocol decode agent; using the protocol decode agent to generate testing stimuli for the SOC based on the transmission signals; delivering the testing stimuli from the protocol decode agent to a test vector generator; and using the test vector generator to deliver the testing stimuli to the SOC.

Example 14 includes the method of any one of example 13, further including using a predefined sequence tester to initially supply testing stimuli to the SOC.

Example 15 includes the method of any one of examples 13-14, wherein receiving transmission signals from a SOC includes receiving transmission signals from a SOC into a testing device where the protocol decode agent is located.

Example 16 includes the method of any one of examples 13-15, wherein using a protocol decode agent to generate testing stimuli for the SOC based on the received transmission signals includes determining what type of protocol is included in the signals that are received from the SOC.

Example 17 includes the method of any one of examples 13-16, wherein delivering the testing stimuli from the protocol decode agent to a test vector generator includes converting protocol commands into digital signals.

Example 18 includes the method of any one of examples 13-17, wherein using the test vector generator to provide the testing stimuli to the SOC includes delivering the testing stimuli from a testing device where the test vector generator is located to the SOC.

Example 19 includes the method of any one of examples 13-18, wherein receiving transmission signals from a SOC into a protocol decode agent includes receiving a plurality of transmission signals from a SOC into a plurality of respective protocol decode agents, and wherein using the test vector generator to deliver the testing stimuli to the SOC includes using a plurality of test vector generators to deliver the testing stimuli to the SOC.

Example 20 includes the method of any one of examples 13-19, wherein receiving transmission signals from a SOC into a protocol decode agent includes receiving the transmission signals from the SOC through an input interface, and wherein using the test vector generator to provide the testing stimuli to the SOC includes using the test vector generator to provide the testing stimuli to the SOC through an output interface.

These and other examples and features of the present electronic device, solder compositions, and related methods will be set forth in part in the detailed description. This overview is intended to provide non-limiting examples of the present subject matter—it is not intended to provide an exclusive or exhaustive explanation. The detailed description is included to provide further information about the systems, and methods.

Figure 7:
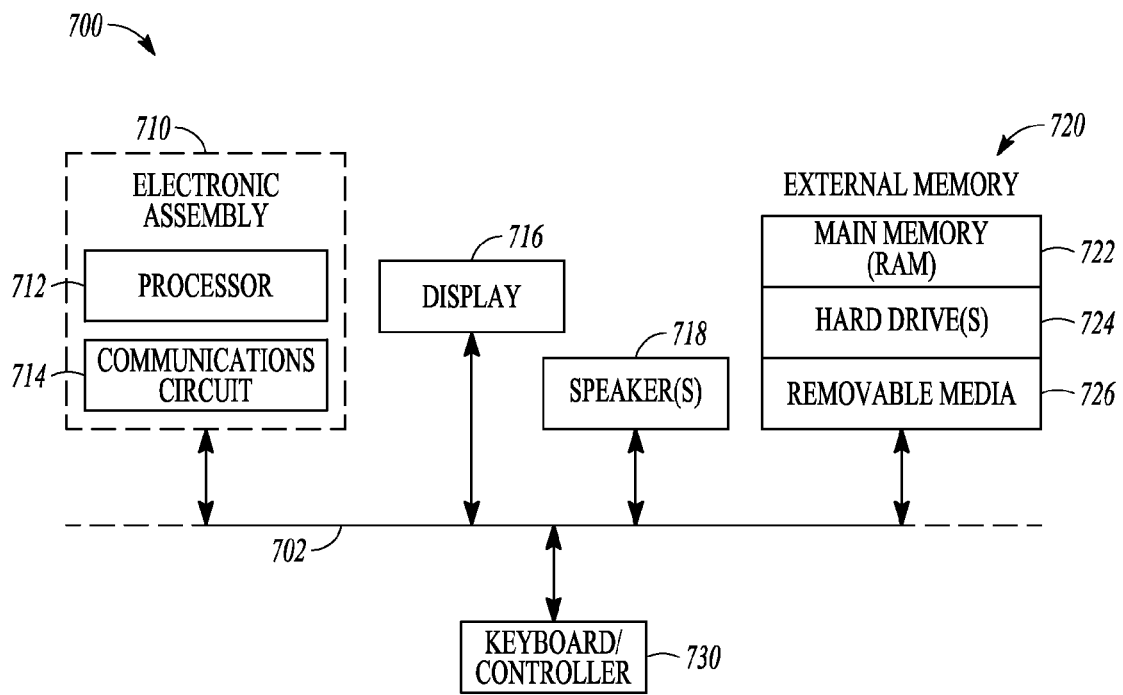
FIG. 7 is a block diagram of an electronic device incorporating at least one SOC testing apparatus and/or method of testing a SOC.

An example of an electronic device using the methods and SOC testing apparatuses described herein is included to show an example of a higher level device application for the methods and SOC testing apparatuses described herein. FIG. 7 is a block diagram of an electronic device 700 incorporating at least one of the methods and SOC testing apparatuses described herein. Electronic device 700 is merely one example of an electronic system in which forms of the methods and SOC testing apparatuses described herein may be used.

Examples of electronic devices 700 include, but are not limited to personal computers, tablet computers, mobile telephones, game devices, MP3 or other digital music players, etc. In this example, electronic device 700 comprises a data processing system that includes a system bus 702 to couple the various components of the system. System bus 702 provides communications links among the various components of the electronic device 700 and can be implemented as a single bus, as a combination of busses, or in any other suitable manner.

An electronic package 710 is coupled to system bus 702. The electronic package 710 can include any circuit or combination of circuits. In one embodiment, the electronic package 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic package 710 are a custom circuit, an application-specific integrated circuit (ASIC), or the like, such as, for example, one or more circuits (such as a communications circuit 714) for use in wireless devices like mobile telephones, tablet computers, laptop computers, two-way radios, and similar electronic systems. The IC can perform any other type of function.

The electronic device 700 can also include an external memory 1620, which in turn can include one or more memory elements suitable to the particular application, such as a main memory 722 in the form of random access memory (RAM), one or more hard drives 724, and/or one or more drives that handle removable media 726 such as compact disks (CD), flash memory cards, digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

This overview is intended to provide non-limiting examples of the present subject matter—it is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system on chip (SOC) testing apparatus comprising:
an input interface;
a protocol decode agent that receives transmission signals into the input interface, the protocol decode agent generates testing stimuli for a SOC based on the transmission signals;
an output interface;
a test vector generator that receives the testing stimuli from the protocol decode agent and supplies the testing stimuli as digital signals to the output interface; and
a SOC connected to the input interface and the output interface, wherein the SOC includes a physical layer that supplies the transmission signals to the input interface and receives tester stimuli from the output interface, wherein the SOC includes a protocol block that receives testing stimuli from the physical layer and delivers transmissions signals to the physical layer.

2. The SOC testing apparatus of claim 1, wherein the input interface is the same type of component as the output interface.

3. The SOC testing apparatus of claim 1, further comprising a testing device that includes the input interface, the output interface, the protocol decode agent and the test vector generator.

4. The SOC testing apparatus of claim 1, wherein the protocol decode agent determines what type of protocol is included in the signals that are received from the SOC.

5. The SOC testing apparatus of claim 1, wherein the SOC includes chip logic that executes the testing stimuli received from the protocol block and delivers further transmissions to the protocol block.

6. The SOC testing apparatus of claim 1, further comprising a predefined sequence tester that initially supplies testing stimuli to the SOC through another input interface of the SOC.

7. A silicon on chip (SOC) testing apparatus comprising:
a plurality of input interfaces;
a plurality of protocol decode agents that each receive transmission signals from one of the respective input interfaces, the protocol decode agents generating testing stimuli for an SOC based on the received transmission signals;
a plurality of output interfaces;
a plurality of test vector generators that each receive testing stimuli from one of the protocol decode agents and each supply the testing stimuli as digital signals to one of the respective output interfaces; and
a SOC connected to the input interfaces and the output interfaces, wherein the SOC includes a physical layer that supplies the transmission signals to the respective input interfaces and receives tester stimuli from the respective output interfaces, wherein the SOC includes a protocol block that receives testing stimuli from the physical layer and delivers transmissions signals to the physical layer.

8. The SOC testing apparatus of claim 7, wherein each of the protocol decode agents determines what type of protocol is included in the signals that are received from the SOC.

9. The SOC testing apparatus of claim 7, further comprising a predefined sequence tester that initially supplies testing stimuli to the SOC through another input interface of the SOC.

10. A method comprising:
receiving transmission signals from a silicon on chip (SOC) into a protocol decode agent;
using the protocol decode agent to generate testing stimuli for the SOC based on the transmission signals;
delivering the testing stimuli from the protocol decode agent to a test vector generator; and
using the test vector generator to deliver the testing stimuli to the SOC; and
wherein receiving transmission signals from a SOC includes receiving transmission signals from a SOC into a testing device where the protocol decode agent is located.

11. The method of claim 10, further comprising using a predefined sequence tester to initially supply testing stimuli to the SOC.

12. The method of claim 10, wherein using a protocol decode agent to generate testing stimuli for the SOC based on the received transmission signals includes determining what type of protocol is included in the signals that are received from the SOC.

13. The method of claim 10, wherein delivering the testing stimuli from the protocol decode agent to a test vector generator includes converting protocol commands into digital signals.

14. The method of claim 10, wherein using the test vector generator to provide the testing stimuli to the SOC includes delivering the testing stimuli from a testing device where the test vector generator is located to the SOC.

15. The method of claim 10, wherein receiving transmission signals from a SOC into a protocol decode agent includes receiving a plurality of transmission signals from a SOC into a plurality of respective protocol decode agents, and wherein using the test vector generator to deliver the testing stimuli to the SOC includes using a plurality of test vector generators to deliver the testing stimuli to the SOC.

16. The method of claim 10, wherein receiving transmission signals from a SOC into a protocol decode agent includes receiving the transmission signals from the SOC through an input interface, and wherein using the test vector generator to provide the testing stimuli to the SOC includes using the test vector generator to provide the testing stimuli to the SOC through an output interface.

* * * * *